US010440848B2

(12) United States Patent
Olien et al.

(10) Patent No.: US 10,440,848 B2
(45) Date of Patent: Oct. 8, 2019

(54) CONFORMABLE DISPLAY WITH LINEAR ACTUATOR

(71) Applicant: IMMERSION CORPORATION, San Jose, CA (US)

(72) Inventors: Neil T. Olien, Montreal (CA); Juan Manuel Cruz-Hernandez, Montreal (CA); Vahid Khoshkava, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 15/848,027

(22) Filed: Dec. 20, 2017

(65) Prior Publication Data

US 2019/0191582 A1   Jun. 20, 2019

(51) Int. Cl.
*H05K 7/02* (2006.01)
*H05K 7/04* (2006.01)
*B32B 37/14* (2006.01)
*B32B 27/08* (2006.01)

(52) U.S. Cl.
CPC .............. *H05K 7/02* (2013.01); *B32B 27/08* (2013.01); *B32B 37/14* (2013.01); *B32B 2457/208* (2013.01)

(58) Field of Classification Search
CPC .......... H05K 7/02; B32B 27/08; B32B 37/14; B32B 2457/208
USPC ........................................................ 361/807
See application file for complete search history.

(56) References Cited

U.S. PATENT DOCUMENTS

| 4,330,730 | A  | 5/1982  | Kurz et al.      |
|-----------|----|---------|------------------|
| 5,245,245 | A  | 9/1993  | Goldenberg       |
| 6,078,126 | A  | 6/2000  | Rollins et al.   |
| 6,160,540 | A  | 12/2000 | Fishkin et al.   |
| 6,337,678 | B1 | 1/2002  | Fish             |
| 6,429,846 | B2 | 8/2002  | Rosenberg et al. |
| 6,629,341 | B2 | 10/2003 | Wilkie et al.    |
| 6,803,924 | B1 | 10/2004 | Snibbe et al.    |
| 6,819,304 | B2 | 11/2004 | Branson          |
| 6,819,312 | B2 | 11/2004 | Fish             |
| 7,196,688 | B2 | 3/2007  | Schena           |
| 8,405,618 | B2 | 3/2013  | Colgate et al.   |
| 8,427,433 | B2 | 4/2013  | Edwards et al.   |
| 8,890,666 | B2 | 11/2014 | Parker et al.    |

(Continued)

FOREIGN PATENT DOCUMENTS

CN   106774963 A   5/2017
EP   2381340 A1   10/2011

(Continued)

OTHER PUBLICATIONS

Choi et al., "Polymers for flexible displays: From material selection to device applications," Progress in Polymer Science 33:581-630 (2008).

(Continued)

*Primary Examiner* — Hung S. Bui
(74) *Attorney, Agent, or Firm* — Medler Ferro Woodhouse & Mills PLLC

(57) ABSTRACT

This disclosure relates to conformable displays, including macro-fiber composite (MFC) actuators. The MFC actuators are configured to displace the conformable displays in a linear direction. The conformable displays can be thin, flexible and deformable.

16 Claims, 12 Drawing Sheets

(56) References Cited

U.S. PATENT DOCUMENTS

| | | |
|---|---|---|
| 9,379,309 B2 * | 6/2016 | Lee .................. H01L 41/37 |
| 2002/0044132 A1 | 4/2002 | Fish |
| 2002/0054060 A1 | 5/2002 | Schena |
| 2002/0108439 A1 | 8/2002 | Whitehead |
| 2003/0174121 A1 | 9/2003 | Poupyrev et al. |
| 2003/0179190 A1 | 9/2003 | Franzen |
| 2004/0041800 A1 | 3/2004 | Daniels |
| 2004/0217877 A1 | 11/2004 | Kokonaski et al. |
| 2004/0233161 A1 | 11/2004 | Shahoian et al. |
| 2005/0030292 A1 | 2/2005 | Diederiks |
| 2005/0040962 A1 | 2/2005 | Funkhouser et al. |
| 2005/0057528 A1 | 3/2005 | Kleen |
| 2006/0099808 A1 | 5/2006 | Kondo |
| 2006/0194619 A1 | 8/2006 | Wilcox et al. |
| 2006/0211217 A1 | 9/2006 | Xu et al. |
| 2007/0211036 A1 | 9/2007 | Perkins |
| 2008/0261057 A1 | 10/2008 | Slobodin |
| 2008/0266273 A1 | 10/2008 | Slobodin et al. |
| 2008/0297878 A1 | 12/2008 | Brown et al. |
| 2008/0303782 A1 | 12/2008 | Grant et al. |
| 2009/0002328 A1 | 1/2009 | Ullrich et al. |
| 2009/0015560 A1 | 1/2009 | Robinson et al. |
| 2010/0090814 A1 | 4/2010 | Cybart et al. |
| 2010/0231541 A1 | 9/2010 | Cruz-Hernandez et al. |
| 2010/0231550 A1 | 9/2010 | Cruz-Hernandez et al. |
| 2010/0238114 A1 | 9/2010 | Vartanian et al. |
| 2011/0193824 A1 | 8/2011 | Modarres et al. |
| 2012/0133494 A1 | 5/2012 | Cruz-Hernandez et al. |
| 2012/0268412 A1 | 10/2012 | Cruz-Hernandez et al. |
| 2013/0201115 A1 | 8/2013 | Heubel |
| 2014/0049463 A1 | 2/2014 | Seo et al. |
| 2014/0247227 A1 | 9/2014 | Jiang et al. |
| 2014/0320396 A1 * | 10/2014 | Modarres .............. G06F 3/0412 345/156 |
| 2016/0221316 A1 | 8/2016 | Yairi et al. |
| 2017/0092897 A1 | 3/2017 | Liu |
| 2018/0190086 A1 * | 7/2018 | Alghooneh .............. B06B 1/06 |
| 2018/0326454 A1 * | 11/2018 | Khoshkava ........... H01L 41/193 |

FOREIGN PATENT DOCUMENTS

| | | |
|---|---|---|
| EP | 3040815 A1 | 7/2016 |
| JP | 2000-148393 A | 5/2000 |
| JP | 2003-060251 A | 2/2003 |
| JP | 2003-280546 A | 10/2003 |
| JP | 2003-288158 A | 10/2003 |
| JP | 2004-071765 A | 3/2004 |
| JP | 2005-114796 A | 4/2005 |
| JP | 2006-154380 A | 6/2006 |
| JP | 2007-121765 A | 5/2007 |
| WO | 01/33648 A1 | 5/2001 |
| WO | 2015/023803 A1 | 2/2015 |

OTHER PUBLICATIONS

E Ink Corporation Technology Flexible Displays, "E-ink Electronic Paper Displays," http://www.eink.com/technology/flexible.html.

Electronic Reusable Paper http://www2.parc.com/hsl/projects/gyricon.

Geekzone Technology Community, "Phillips Paper-like Display Earlier Than Expected," http://www.geekzone.co.nz/content.asp?contentid=5142.

Gizmodo, "NEC's Flexible Battery," http://gizmodo.com/gadgets/peripherals/necs-flexible-battery-141747.php.

Physorg.com Science Physics Tech Nano News, "Water-Thin Color Displays for Packaging," http://www.physorg.com/printnews.php?newsid=7079.

Physorg.com Science Physics Tech Nano News, "World's First Film Substrate-based Bendable Color Electronic Paper featuring Image Memory Function," http://www.physorg.com/printnews.php?newsid=5142.

S. Terryn, G. Mathijssen, J. Brancart, D. Lefeber, G. Van Assche, and B. Vanderborght, "Development of a self-healing soft pneumatic actuator: a first concept," Bioinspiration and Biomimetics, 2015, available at https://softroboticstoolkit.com/publications/development-self-heaiing-soft-pneumatic-actuator-first-concept.

Soft Robotics Toolkit, "Self-healing Materials," https://softroboticstoolkit.com/book/self-healing-materials-0.

Terryn, Seppe et al.; "Investigation of Self-Healing Compliant Actuators for Robotics"; 2015 IEEE International Conference on Robotics and Automation (ICRA); Washington State Convention Center; Seattle, Washington; May 26-30, 2015.

Visual Planet-Dynamic Visual and Visual Interactive Solution Provider, "VIP Interactive foil in Action" http://www.visualplanet.biz/products/touchfoil/.

Office Action dated Jul. 20, 2017, from U.S. Appl. No. 15/395,726.

Office Action dated Sep. 9, 2015, from U.S. Appl. No. 14/262,403.

The Extended European Search Report issued in European Application No. 18207269.4, dated Jun. 14, 2019.

* cited by examiner

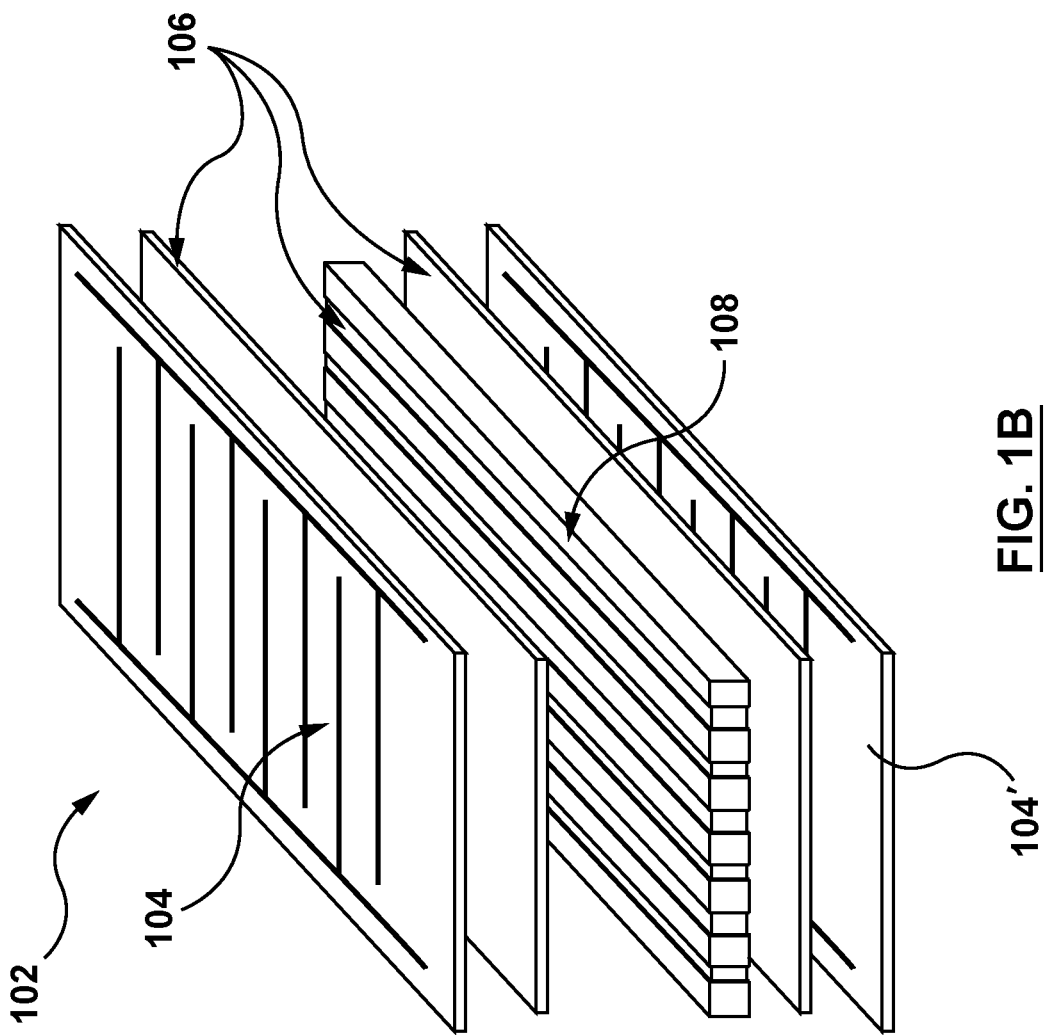
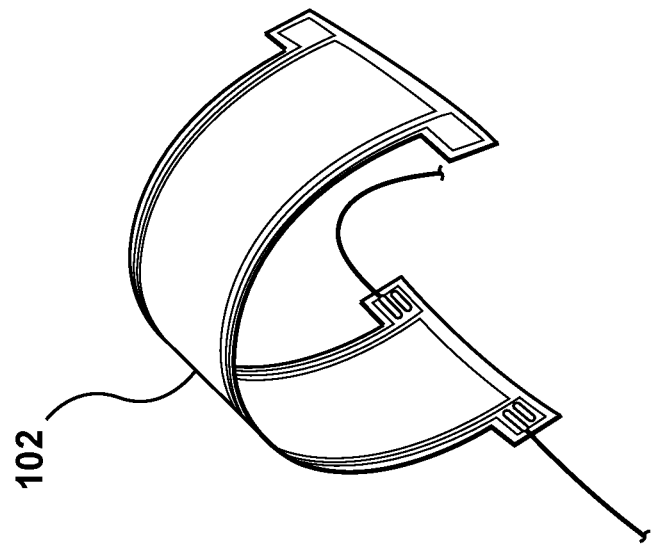
FIG. 1A
FIG. 1B

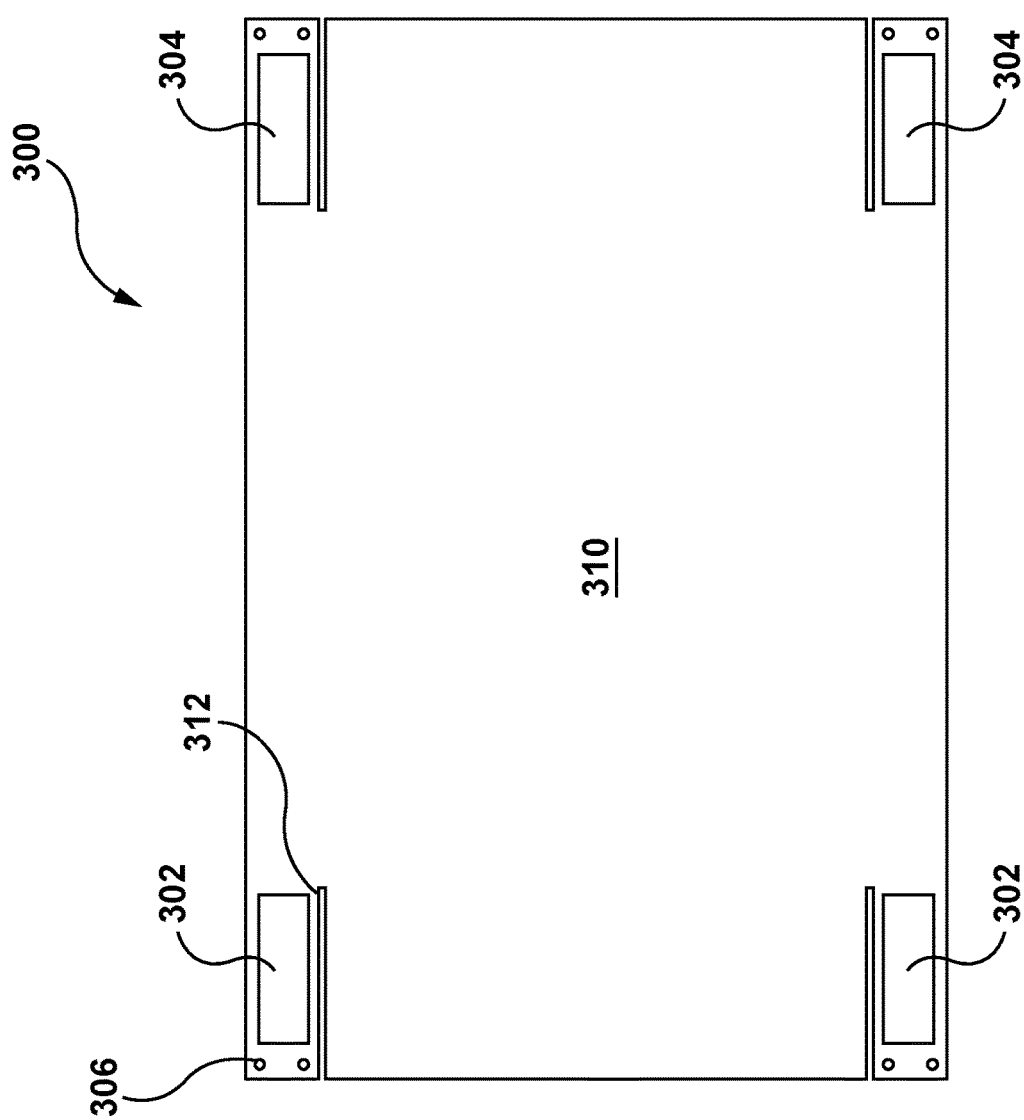

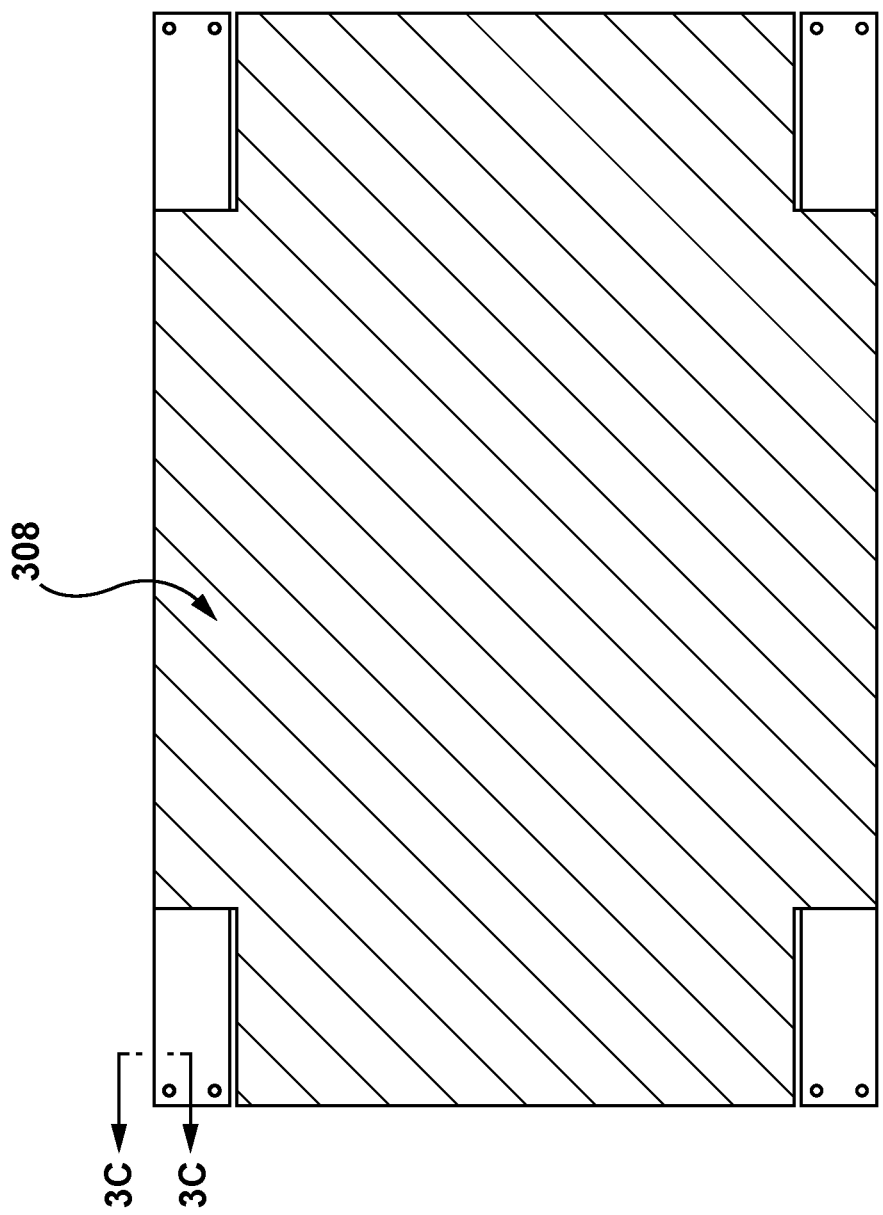

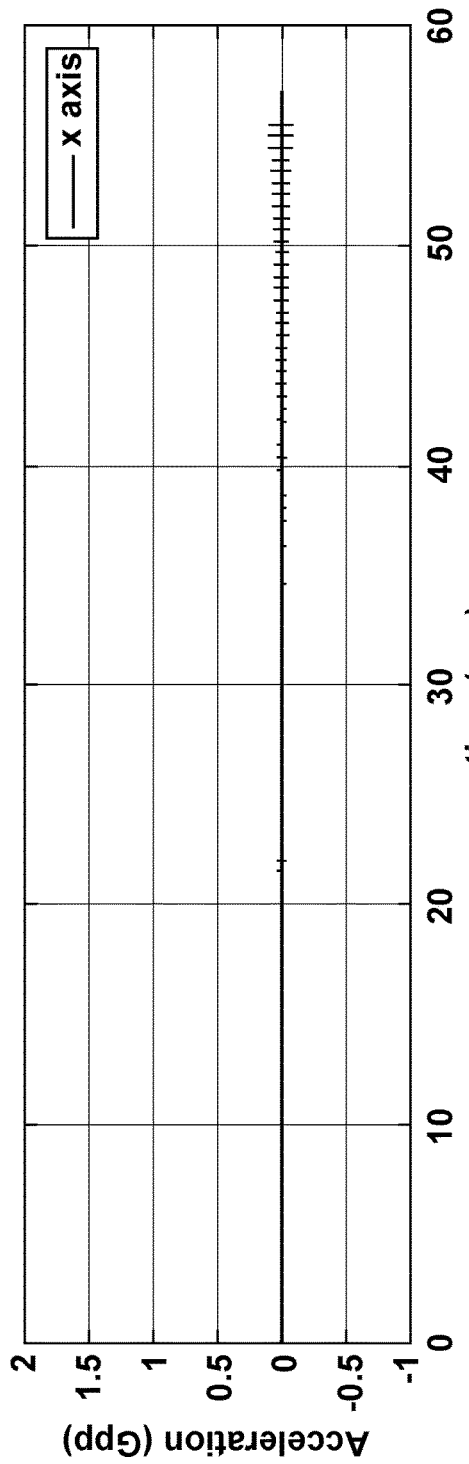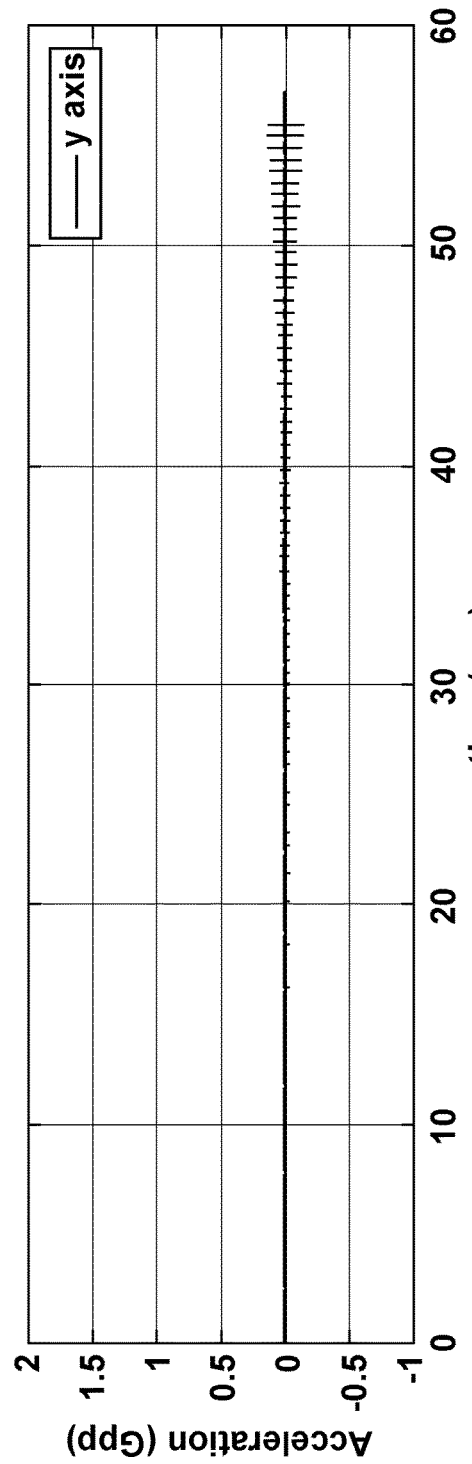

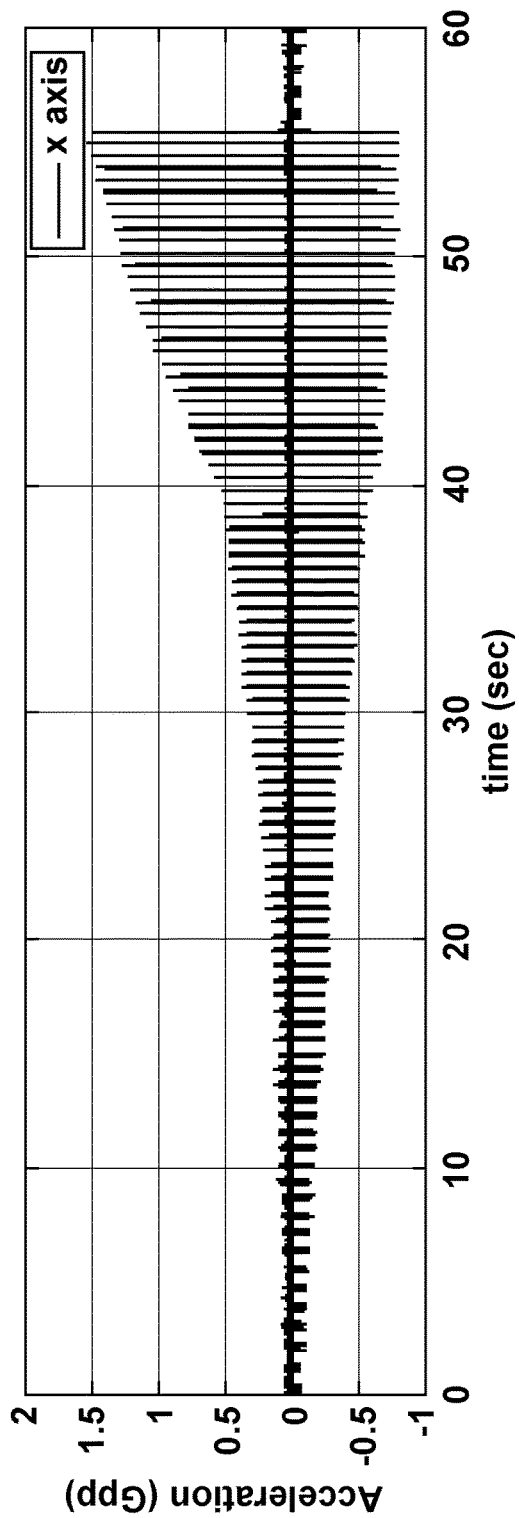
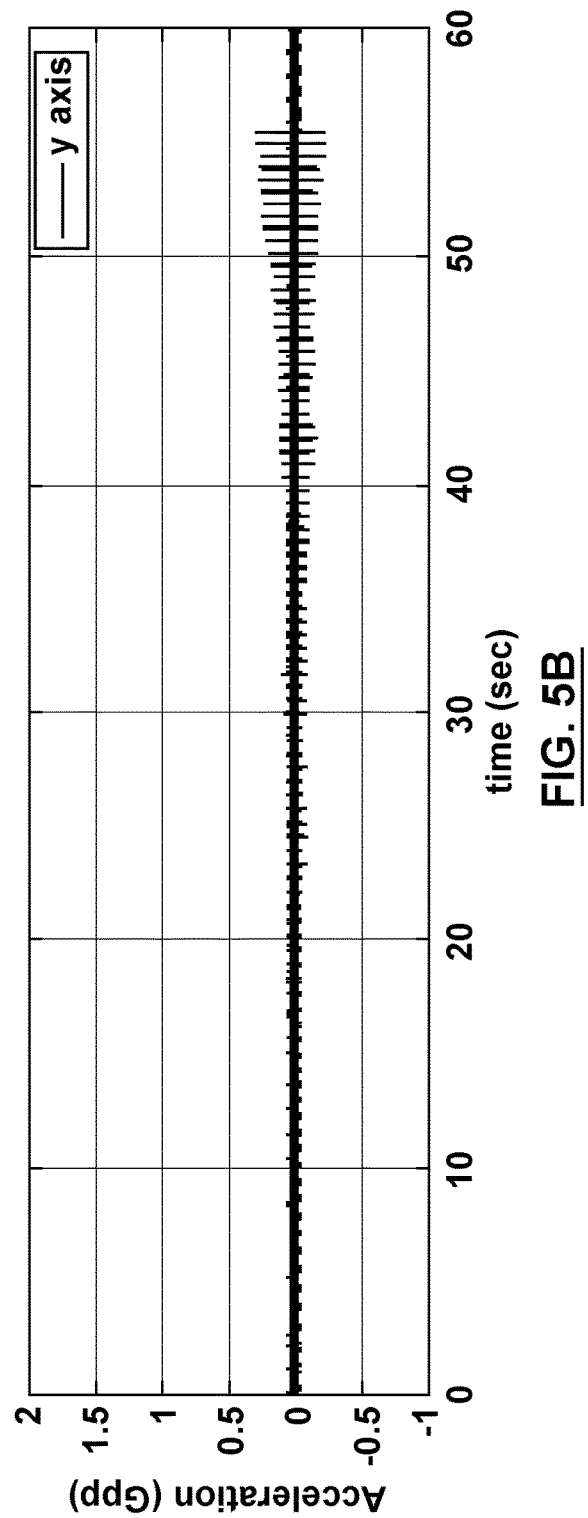
FIG. 5A
FIG. 5B

CONFORMABLE DISPLAY WITH LINEAR ACTUATOR

TECHNICAL FIELD

This disclosure relates to conformable displays, including macro-fiber composite (MFC) actuators. The MFC actuators are configured to displace the conformable displays in a linear direction. The conformable displays can be thin, flexible and deformable.

BACKGROUND

Various haptic actuation technologies have been used to provide vibrotactile haptic feedback to displays of touch sensitive devices, such as touch screens. Traditional haptic feedback devices use electric actuators, such as Linear Resonant Actuator ("LRA") devices and Eccentric Rotating Mass ("ERM") devices, or solenoids. However, these actuators are generally not scalable and do not always perform sufficiently in haptic applications. These devices are often very bulky and can have difficulty meeting certain space limitations.

Another conventional haptic feedback technology in touch sensitive devices is electro-active polymer ("EAP") devices. One drawback of this technology, however, is that EAP-based actuators normally require thousands of volts of electricity to provide effects that are suitable for haptic applications.

In addition, integrating haptic actuation into conformable displays requires that the display, and thus also the haptic actuator, be non-flat and/or bendable. What is needed therefore are actuators that can be used to generate haptic feedback in conformable displays.

SUMMARY

Provided herein are conformable displays, which include a display element and a linear macro-fiber composite (MFC) actuator. The MFC actuator includes a first laminate layer, a second laminate layer, and a macro-fiber composite actuator disposed between the first laminate layer and the second laminate layer. In embodiments, the linear MFC actuator is attached to the display element and also attached to a support structure.

Also provided herein are conformable displays including a first display layer, a second display layer, and a macro-fiber composite (MFC) actuator disposed between the first display layer and the second display layer.

In additional embodiments, provided herein is a method of producing a conformable display, which includes laminating a first display layer and a second display layer onto a macro-fiber composite (MFC) actuator, and creating a cut-out in the first and second display layers adjacent the macro-fiber composite actuator.

In further embodiments, provided herein is a method of provided haptic feedback via a conformable display, which includes contacting a conformable display as described herein, applying a voltage to the MFC actuator in response to the contacting, and generating haptic feedback via a lateral displacement in the plane of the conformable display.

Also provided are conformable surfaces, which include a surface element and a linear macro-fiber composite (MFC) actuator, including a first laminate layer, a second laminate layer, and a macro-fiber composite actuator disposed between the first laminate layer and the second laminate layer, wherein the linear MFC actuator is attached to the surface element and also attached to a support structure.

BRIEF DESCRIPTION OF THE DRAWINGS

The foregoing and other features and aspects of the present technology can be better understood from the following description of embodiments and as illustrated in the accompanying drawings. The accompanying drawings, which are incorporated herein and form a part of the specification, further serve to illustrate the principles of the present technology. The components in the drawings are not necessarily to scale.

FIG. 1A shows a macro-fiber composite (MFC) in accordance with an embodiment hereof.

FIG. 1B shows an expanded view showing the components of a macro-fiber composite (MFC) in accordance with an embodiment hereof.

FIGS. 3A-3B show conformable displays including MFC actuators in accordance with an embodiment hereof.

FIGS. 4A-4C shows acceleration of an MFC mounted to a substrate, with only a single side mounted.

FIGS. 5A-5C shows acceleration of a linear MFC actuator, in accordance with embodiments hereof, where the MFC is disposed between two laminate layers.

DETAILED DESCRIPTION

Figure 2A:
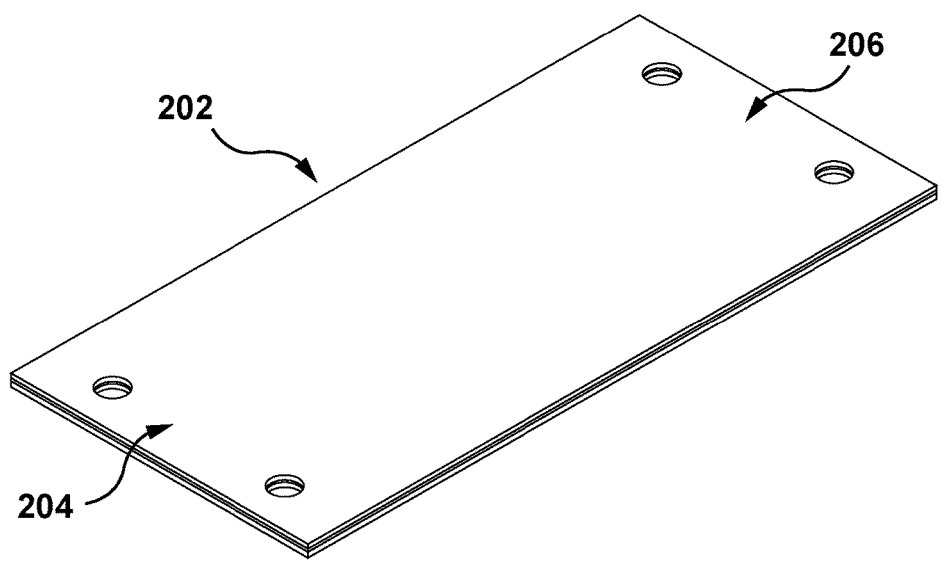
FIG. 2A shows a linear MFC actuator in accordance with an embodiment hereof.

The foregoing and other features and aspects of the present technology can be better understood from the following description of embodiments and as illustrated in the accompanying drawings. The accompanying drawings, which are incorporated herein and form a part of the specification, further serve to illustrate the principles of the present technology. The components in the drawings are not necessarily to scale.

As used herein "haptic feedback," "haptic feedback signal," or "haptic signal" are used interchangeably and refer to information such as vibration, texture, and/or heat, etc., that are transferred via the sense of touch from a system, conformable display, or haptic feedback generator, as described herein, to a user.

In embodiments provided herein are conformable displays that incorporate, or are based on, the use of a macro-fiber composite to provide linear actuation, and thus haptic feedback.

Macro-fiber composites (MFC), or MFC actuators (102 in FIGS. 1A-1B), in accordance with embodiments hereof suitably include rectangular piezo ceramic (suitably ribbon-shaped) rods 108 sandwiched between layers of adhesive 106 (e.g., epoxy layers), and electrodes and polyimide film 104 and 104' that are formed into a thin conformable sheet (see FIG. 1B). The electrodes are attached to the film in an interdigitated pattern which transfers an applied voltage to the MFC directly to and from the ribbon-shaped rods. This assembly enables in-plane poling, actuation and sensing in a sealed and durable, ready to use package. Such an MFC actuator that is formed as a thin, surface conformable sheet can be applied (normally bonded) to various types of structures or embedded in a composite structure. If voltage is applied, the MFC will bend or distort materials, counteract vibrations or generate vibrations. If no voltage is applied, the MFC can work as a very sensitive strain gauge, sensing deformations, noise and vibrations. The MFC actuator is also an excellent device to harvest energy from vibrations. See, e.g., U.S. Pat. No. 6,629,341, the disclosure of which is incorporated by reference herein in its entirety for all purposes, including the disclosure of the structure and materials useful in forming MFCs.

In embodiments, provided herein are conformable displays which include MFC actuators. As used herein a "conformable display" refers to a screen or other device for presenting an image which is substantially flat and in embodiments, can be bent, deformed, molded or otherwise modified to take a shape other than a flat, planar surface. The terms "conformable display" and "conformed display" are used interchangeably herein. Conformable displays include displays that are 1) rigid, thin and flat; 2) rigid, thin and curved (but not deformable); 3) thin and flexible (i.e., deformable); and 4) thin and rollable or foldable upon itself "Conformable displays" can also include static surfaces with printed or projected images and touch sensing technology.

One of the desired goals regarding the conformable displays described herein is that they can be moved laterally, in the plane of the display (i.e., in an X-Y plane of the display), with minimal movement (displacement of less than 25% of the display thickness) out of the plane of the display (i.e., Z-plane of the display). The use of MFC actuators, and in particular linear MFC actuators as described herein, are used to achieve this goal.

Figure 2B:
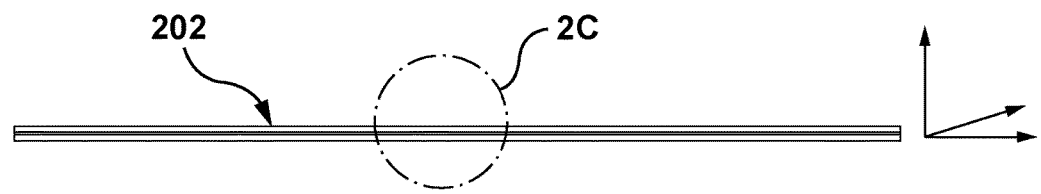
FIG. 2B shows a side view of a linear MFC actuator in accordance with an embodiment hereof.
Figure 2C:
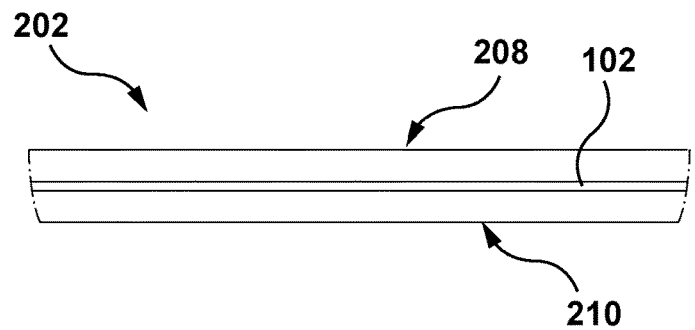
FIG. 2C shows a sectional view of a linear MFC actuator, taken through line C, in accordance with an embodiment hereof.

FIG. 2A shows an exemplary linear macro-fiber composite (MFC) actuator 202 in accordance with embodiments hereof. FIG. 2B shows a side view of linear MFC actuator 202. FIG. 2C shows a sectional view of linear MFC actuator 202 taken through line C of FIG. 2B. As shown in FIG. 2C, linear MFC actuator 202 includes a first laminate layer 208, a second laminate layer 210, and a macro-fiber composite (MFC) 102 disposed between the first laminate layer and the second laminate layer.

As used herein first and second "laminate layers" refer to thin, structural layers that are disposed on the upper and lower surface of an MFC. Laminate layers 208 and 210 are suitably on the order of a few microns to a few millimeters to 10s of millimeters in thickness. Laminate layers suitably comprise polymeric materials, including for example various acrylics, silicone polymers (e.g., polydimethylsiloxane), etc. Laminate layers 208 and 210 can also comprise fiberglass or other composite materials. Laminate layers 208 and 210 are suitably rigid in the Z direction (i.e., out of the plane of the laminate), but flexible in the planar direction of the laminate, allowing for relatively little motion in the Z direction (in the form of resultant bending), but sufficient displacement in the X-Y plane (see FIG. 2B). In embodiments, motion in the Z direction can be relatively small, for example on the order of a few microns, in response to actuation in the X-Y plane from an actuator, as described herein. Also encompassed herein are embodiments in which an MFC is provided in a pre-laminated configuration—i.e., already including a first and second laminate layers in the design or manufacture of the MFC.

In additional embodiments, laminate layers 208 and 210 can comprise more than one layer of material, including for example, a rubber or flexible material disposed on the MFC, with an additional stiff layer on top of the flexible material, which can also achieve this type of linear motion. Suitably, laminate layers 208 and 210 are substantially transparent, though in other embodiments, they can be opaque or completely solid in appearance. Exemplary materials for laminate layers 208 and 210 include polymeric and plastic materials, various metals such as steel, copper, aluminum, as well as composites include carbon fiber composites, thermoplastics, wood (natural or engineered), etc.

Structurally, it is desirable that laminate layers 208 and 210 be substantially similar in both size (i.e., planar dimensions) as well as thickness, so as to provide a uniform and substantially equal stiffness to both the top and bottom of linear MFC actuator 202 to which they are bonded. In embodiments, it is desirable to have laminate layers 208 and 210 have the same spatial geometry (i.e., size in planar and thickness dimensions), as well as mechanical geometry (same mechanical properties) so as to limit undesirable bending and to provide uniform lateral movement.

Laminate Layers 208 and 210 are also stiff in the Z-direction (i.e., plane out of the surface of MFC 102, see FIG. 2B), but allow for linear flexibility in the X and Y directions (i.e., in the plane of the surface of MFC 102. Bonding or disposing first and second laminate layers 208 and 210 onto MFC actuator 102 can include the use of various adhesives or glues, as well as direct polymerization, heat bonding, etc. In additional embodiments, a deposition process can be used to deposit laminate layers 208 and 210 on the MFC. Suitably, the entire contacting surface area of laminate layers 208 and 210 is bonded to the MFC (entire area where laminate layers contact the MFC), either via adhesive, polymerization, or other mechanism. In other embodiments, a portion of the MFC (e.g., a strip in the middle) can be left un-laminated, while the remaining portions of the laminate layers provide the necessary stiffness to provide linear motion.

Linear MFC actuator 202 suitably includes a fixed end 204 and a movable end 206, though the positioning and orientation of these ends can be reversed or otherwise modified as desired. When one end (e.g., 204) of linear MFC actuator 202 is fixed (i.e., connected to a support structure, e.g., the frame of a car, television set, laptop, monitor, computer etc.), the remaining free end (e.g., 206) can move in a linear manner (i.e., in the plane of the MFC and laminate layers).

The MFC in response to an applied voltage will either expand or elongate (P1 type MFC), contract (P2 type MFC) or undergo shearing (P3 type) (suitably on the scale of a few microns of deformation). If only a single laminate layer is placed on the top or bottom of the MFC, the laminate layer will bend or curve, in response to the expansion, contraction, or shearing, of the MFC.

However, when placed between two laminate layers of sufficient stiffness in the Z direction, but with flexibility in the X-Y directions, activation of the MFC results in linear motion and deformation. That is, the bending with a single laminate layer is translated into linear motion when the MFC is between two laminate layers. This allows free end 206 to move in a linear manner, away from fixed end 204. Provided below are some exemplary properties and characteristics of MFCs which can be used in embodiments herein:

| | |
|---|---|
| Max. blocking Force | 28 N to 1 kN depending on width of MFC |
| Max. operating Voltage | P1 (S,F1): −500 to +1500 V<br>P2, P3: −60 V to 360 V |
| Max. operating Frequency | Actuator: 10 kHz<br>Sensor, Harvester: <3 MHz |
| Typical lifetime | Actuator: 10E+8 cycles<br>Sensor: 10E+11 cycles<br>Harvester: 10E+10 cycles |
| Typical thickness | 300 μm, 12 mil |
| Typical capacitance | P,S,F1: 2 nF to 12 nF<br>P2, P3: 25 nF to 200 nF |

In further embodiments, the thickness of the laminate layers can be thinner than noted above, or thinner layers can be stacked upon each other to achieve the final desired thickness and results. The voltage and blocking force of the MFC will depend upon the thickness and number of laminate layers utilized. For example, a 50 N blocking force can be achieved by utilizing multiple thin laminate layers stacked together, and potentially utilizing a voltage in the range of about 300V to about 1500V.

Figure 2D:
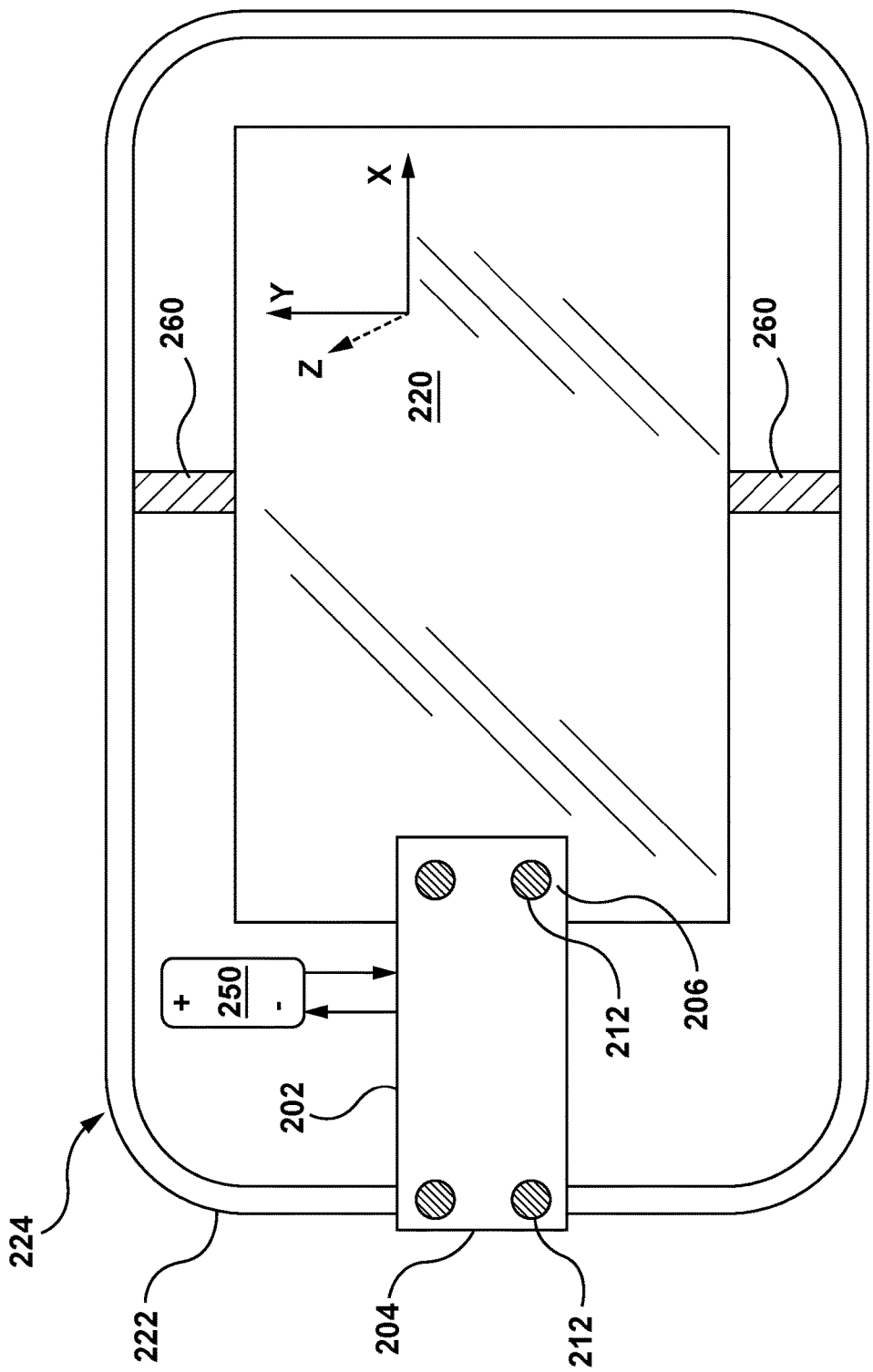
FIGS. 2D-2E shows the attachment of linear MFC actuator(s) to a display element to form a conformable display, in accordance with an embodiment hereof.

In additional embodiments, as shown in FIG. 2D, provided herein is a conformable display 224, which includes a display element 220 and linear macro-fiber composite (MFC) actuator 202 (multiple MFC actuators 202 can also be used in different positions), which as described herein includes first laminate layer 208, second laminate layer 210, and macro-fiber composite 102 disposed between the first laminate layer and the second laminate layer. Conformable display 224 also includes a support structure 222 to which linear MFC actuator 202 is attached (i.e., fixed end 204). Movable end 206 of linear MFC actuator 202 is attached to display element 220. In embodiments, attachment mechanisms 212 can include various screw, bolts, rivets, brads, nails, etc., as well as bonding materials including glues, adhesives, solder points, etc. Display element 220 can also be further attached to support structure 222 via an additional support element 260 (or multiple supports), or support element 260 can otherwise provide a mechanism to maintain the display element in a desired configuration for viewing, etc. Exemplary display elements 220 include liquid crystal displays (LCD), light emitting diode (LED) displays, organic LED (OLED) displays, electronic ink (e-ink) displays, plasma displays, nanocrystal or quantum dot-based displays, etc. Suitably, display element 220 includes a polymeric material to form the outside of the screen, as is well known in the art.

Upon application of a voltage from power source 250 (e.g., a battery, electrical outlet, etc.; wiring of leads on MFC is not shown), free end 206 of linear MFC actuator 202 causes display element 220 to move in a planar direction, i.e., in the X and/or Y directions, as well as combined X-Y directions (see FIG. 2D), in a linear manner (fixed end 204 remains stationary, attached to support structure 222). Very little Z-direction (i.e., out of the plane of display element 220) occurs as the displacement of the MFC has been converted to linear motion by way of laminated layers 208 and 210 (as opposed to a bending motion), if only a single laminated layer were to be used. Use of a P1 type MFC in linear MCF actuator 202 would cause an expansion of MFC, resulting in motion of screen element 220 in the positive X direction (and likely concurrent movement in the Y direction). Use of a P2 type MFC in linear MFC actuator 202 would cause a contraction of the MFC, resulting in motion of screen element 220 in the negative X direction (and likely concurrent movement in the Y direction). Use of a P3 type MFC in linear MFC actuator 202 would case shear motion in the MFC, resulting in motion in both the X and Y directions (and combined X-Y direction).

Figure 2E:
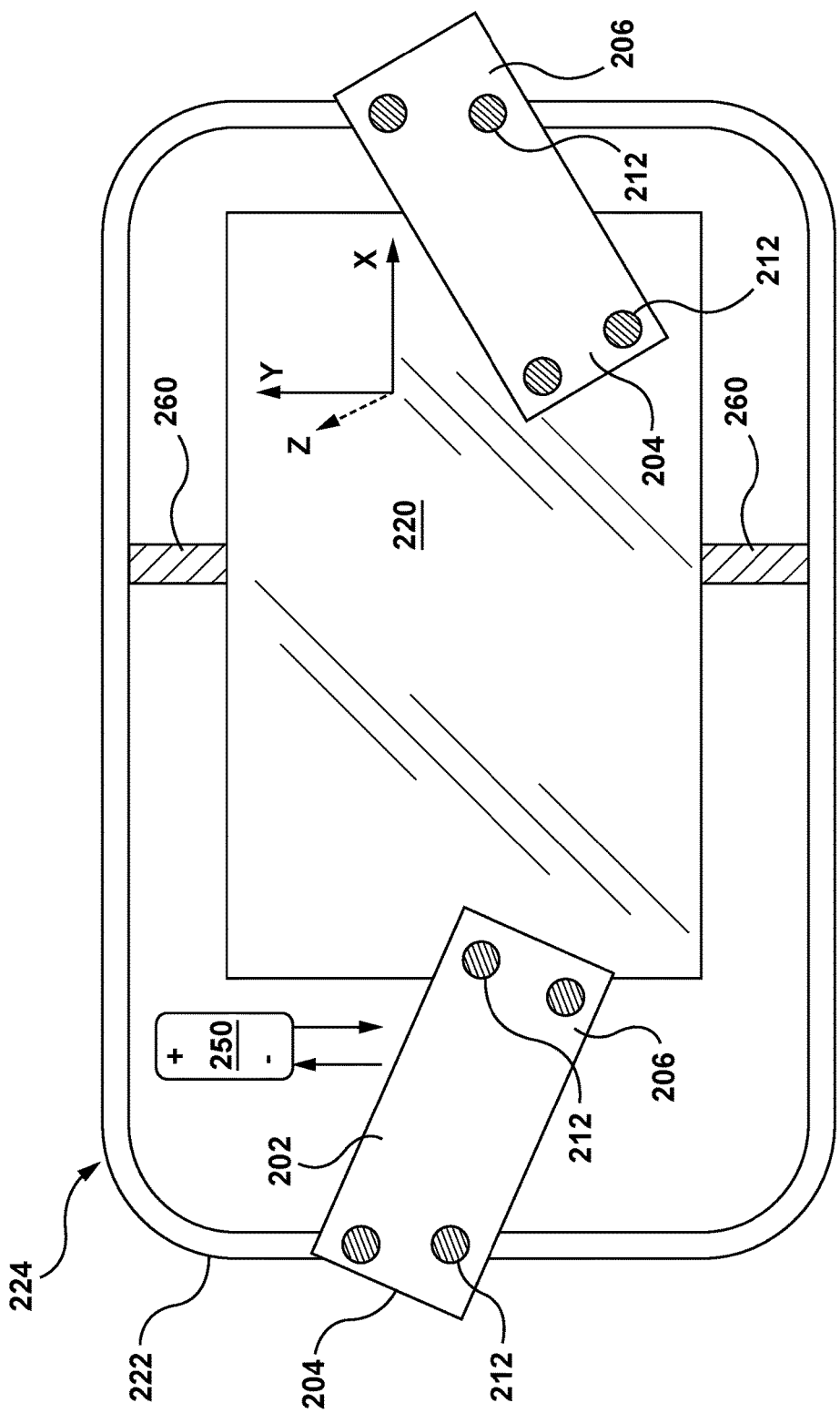

In additional embodiments, MFC actuator 202 can be mounted at an angle to display element 220, or multiple MFC actuators 202 can be mounted at angles to display element 220, allowing for haptic feedback in the X-Y plane in all X-Y directions (see, e.g., FIG. 2E). Elements are the same as above in FIG. 2D.

Figure 3C:
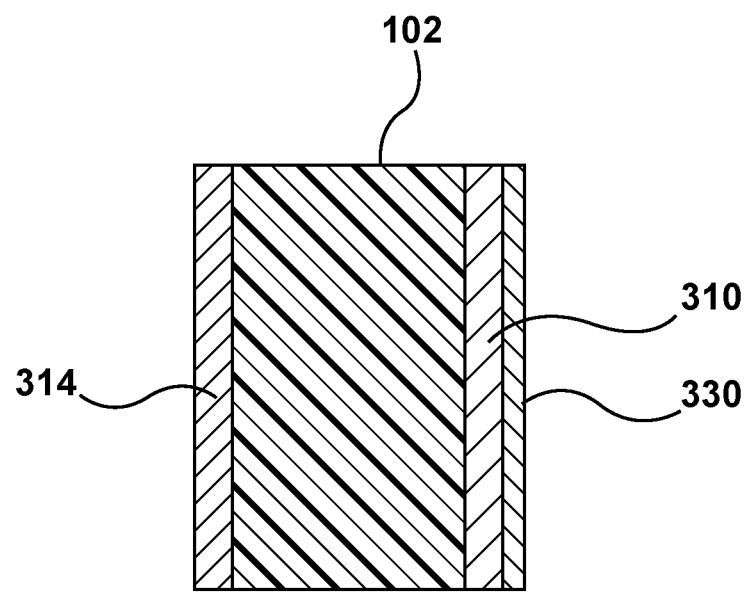
FIG. 3C shows a sectional view of an MFC actuator in a conformable display, in accordance with an embodiment hereof.

FIGS. 3A-3C show a further embodiment, including a conformable display 300, which includes a first display layer 310, a second display layer 314 and a macro-fiber composite (MFC) actuator 102 disposed between the first display layer 310 and the second display layer 314 (see FIG. 3C, showing cross section of conformable display and MCF taken through C-C of FIG. 3B). An additional layer (e.g., a touch screen layer 330, can also be added if desired to provide additional stiffness, and/or protection, to the display layers. In addition, in further embodiments, the conformable displays described herein can act as the touch screen portion of a display screen or device.

In FIG. 3A, conformable display 300 is shown with four MFC actuators, including expanding MFC actuators 302 and contracting MFC actuators 304. While conformable display 300 is shown using four MFC actuators, lateral movement in the plane of the display element (i.e., X-Y plane) can be achieved using 1, 2, 3, 4, 5, 6, 7, 8, 9, 10, etc., MFC actuators.

As shown in FIG. 3A, mounting holes 306 act as points for attachment of conformable display 300 to a support structure (not shown), which can include the frame of a monitor, a laptop section, a cellular phone, a watch, a tablet, a car dash, etc. These attachment points at both sides of conformable display 300 act as fixed ends, confining the motion of the MFC actuator. Upon application of a voltage to the MFCs (power source(s) and lead connections now show), expanding MFC actuators (P1 type) 302 will expand, while contracting MFC actuators (P2) type 304 will contract, resulting in motion of the conformable display 300 in a planar direction (i.e., in the plane of the display elements of the conformable display) in the positive X direction (see FIG. 3B). Some motion in the Y direction is also possible. If MFC actuators 302 and 304 are switched (i.e., contracting MFCs on the left side, expanding MFCs on the right side), conformable display 300 will move in the negative X direction. By balancing the number and orientation of the MFCs, the desired lateral motion can be achieved.

Conformable display 300 also includes cut-outs 312, which suitably extend the length of the MFC actuators, and are positioned close to the edge of the MFCs. Cut outs 312 allow for the movement of conformable display 300, without requiring the MFC to move material abutting the MFC. The result is a haptic area 308 (FIG. 3B), which moves laterally in the plane of the display elements 310/314, and can provide haptic feedback to a user in the form of a vibration, back and forth rocking, or lateral, X-Y motion, etc.

Exemplary materials for use in first display layer 310 and second display layer 314 include various polymeric materials, as well as glass, and are substantially transparent layers. Exemplary polymeric materials include, but are not limited to, polycrystalline silicon, polyethylene terephthalate (PET), polyethylene naphthalate (PEN), polyetheretherketone (PEEK), polycarbonate, polyethersulphone, polycyclic olefin, polyacrylate, polyimide, etc. (see, Choi et al., "Polymers for flexible displays: From material selection to device applications," *Progress in Polymer Science* 33:581-

630 (2008), the disclosure of which is incorporated herein for all purposes.) Additional elements for use in conformable displays, including light emitting diodes, liquid crystals, quantum dots, etc., needed to produce an image on a conformable display can also be incorporated in the displays described herein, or otherwise associated with the displays.

As described herein, in embodiments, conformable display 300 suitably includes at least two MFC actuators disposed between first display layer 310 and second display layer 314, and these MFCs are suitably located at opposite sides of the conformable display so as to facilitate uniform movement. In exemplary embodiments, as shown in FIGS. 3A-3B, four MFC actuators are utilized, disposed between the first display layer and the second display layer. The four MFC actuators are suitably positioned at four opposing corners of the conformable display, so as to optimize the lateral movement of conformable display 300. As described herein, two of the MFC actuators on the same side are expanding MFC actuators (302) (P1-type) while the two MFC actuators on the opposite side are contracting MFC actuators (304) (P2-type).

The shape and size of conformable display 300 is suitably dictated by the ultimate type of application, whether a cellular phone, tablet, watch screen, laptop, television, kiosk screen, bank ATM, computer monitor, video game system, etc. In addition, the conformable displays described herein can be curved or flat, and also can be deformable or bendable, including with the ability to be rolled-up or folded upon themselves.

The conformable displays described herein, as well as the linear MFC actuators, can be implemented in various applications, including as screen or display elements for cellular phones, watches, tablets, laptops, monitors, televisions, bank machines, interactive kiosks, gaming systems or arcade machines, touchpads for ordering at stores, interactive screens in automobiles and airplanes, etc. In further embodiments, the conformable displays and linear MFC actuators described herein can be integrated with or be part of a virtual reality or augmented reality system.

In additional embodiments, the laminated MFC actuators described herein can be utilized to create conformable surfaces. As used herein, a "conformable surface" refers to a material which is substantially flat and in embodiments, can be bent, deformed, molded or otherwise modified to take a shape other than a flat, planar surface. In such embodiments, a linear macro-fiber composite (MFC) actuator, including a first laminate layer, a second laminate layer, and a macro-fiber composite actuator disposed between the first laminate layer and the second laminate layer, is attached to a surface element. As used herein "surface element" refers to a substantially flat and thin material element, with a width and length that are significantly larger than the thickness of the surface element. Exemplary surface elements include various glasses, polymers and plastics.

The various conformable displays can also be used as sensors, as the MFCs contained within or associated with the conformable displays are known to act as sensor materials. For example, sensing can take the form of capacitive, resistive, infrared, piezoelectric sensing, etc. In such sensing applications the conformable display can be part of a touch screen, a sliding interface, a button interface, etc.

In additional embodiments, provided herein are methods of producing a conformable display. The methods of production include laminating first display layer 310 and second display layer 314 onto macro-fiber composite (MFC) actuator 102. Methods of laminating include the use of adhesives and glues, as well as direct polymerization to the surface of the MFC. The methods further include creating a cut-out (see e.g., 312 in FIG. 3A) in the first and second display layers adjacent the macro-fiber composite. As described herein, it is desirable to have a cut-out in the conformable display adjacent the MFC, so as to limit the amount of adjacent material that must be moved by the MFC, and also to allow for more uniform movement.

In embodiments, four MFC actuators are suitably laminated between the first display and the second display layers to create a conformable display with four MFC actuators at the corners of the display to allow for uniform displacement. As described throughout, in embodiments, the first display layer and the second display layer have the same length, width and thickness, and the entire surface area of contact between the first display layer and the second display layer and the MFC actuators are laminated or bonded together so as to ensure uniform movement and displacement.

Also provided herein are methods of provided haptic feedback via a conformable display. The methods suitably include contacting a conformable display as described herein, for example, with a user's touch (finger), a stylus, or other contact. In response to the contacting, a voltage is applied or triggered to activate the MFC actuator. As described herein, in response to the voltage, the MFC actuator generates a lateral displacement of the conformable display in the plane of the display, providing haptic feedback to the user. Suitably little (on the order of less than 25%, i.e., 5-25%) displacement is observed in the Z-direction, i.e., out of the plane of the laminate layers and the MFC actuator. Less than 25% displacement refers to the distance that a conformal display moves in the Z direction, when measured relative to it's thickness (i.e., movement in the Z direction is suitably less than 25% as compared to the thickness of the conformal display). In further embodiments, Z axis acceleration should be less than 25% of the acceleration in the desired directions (i.e., X and or Y directions).

In embodiments, the haptic feedback that is generated can be in the form of vibrational feedback as lateral displacement of the conformable display. The frequency of the vibrational feedback is suitably in the range of about 10-500 Hz, suitably about 50-300 Hz, though vibrations in the kHz range can also be achieved.

Figure 4C:
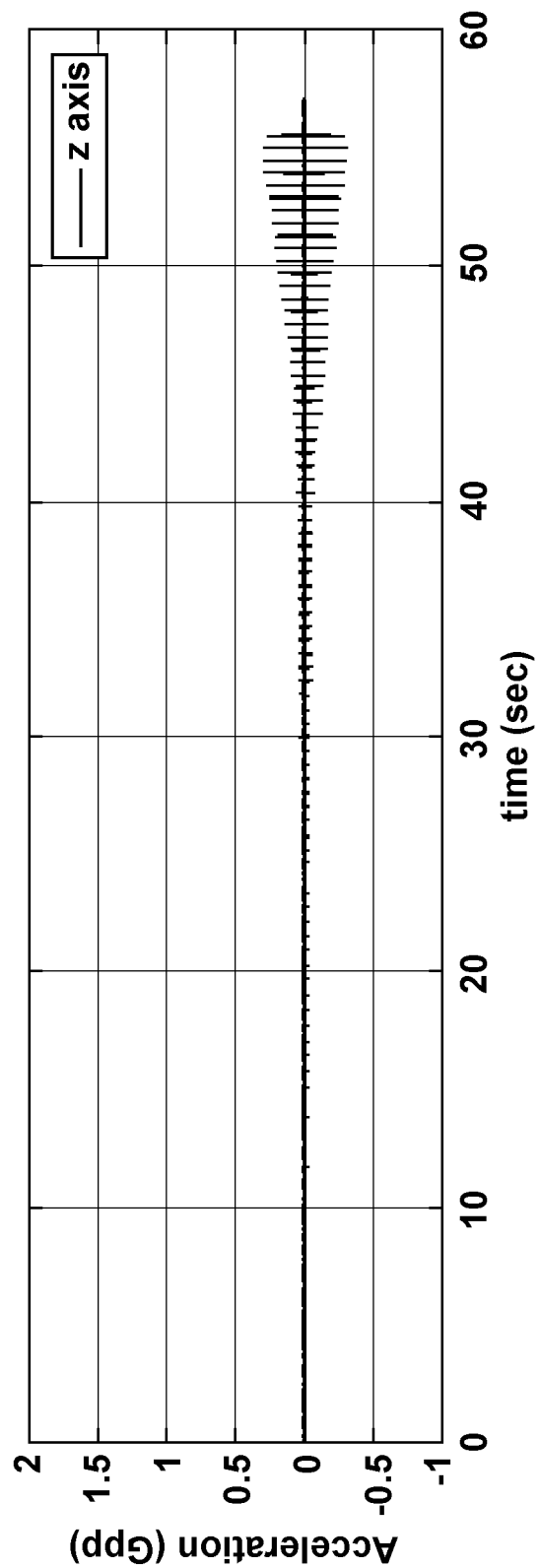

FIGS. 4A-C show an example of a P1-type MFC actuator bound to a substrate (e.g., a display screen), in which only one flat side of the MFC is bound to the screen. The other side is not bound to any additional substrate. In such a mode, the MFC, in response to an applied voltage, extends, resulting in a bending of the substrate. This is observed in accelerations (Gs) primarily in the Z-direction (FIG. 4C) (out of the plane of the substrate and of the MFC) as a function of time, with little or minimal X-Y axis acceleration (in the planar direction of the substrate and MFC), see FIGS. 4A and 4B, respectively.

Figure 5C:
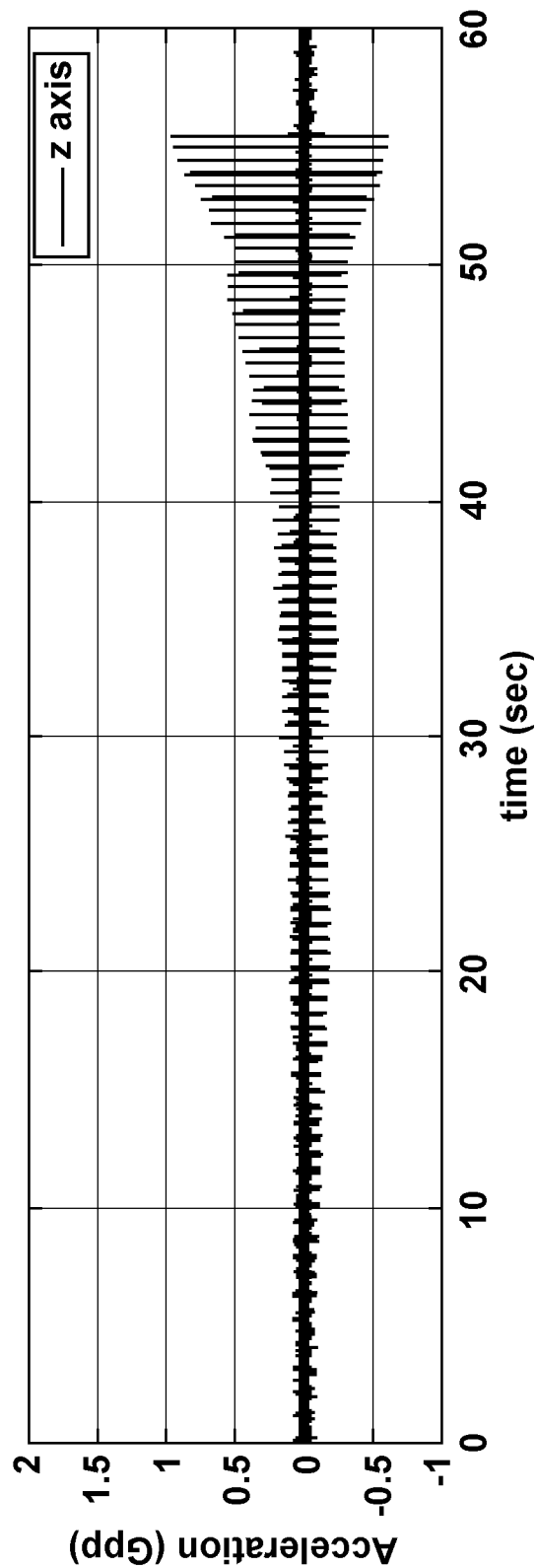
Figure 5D:
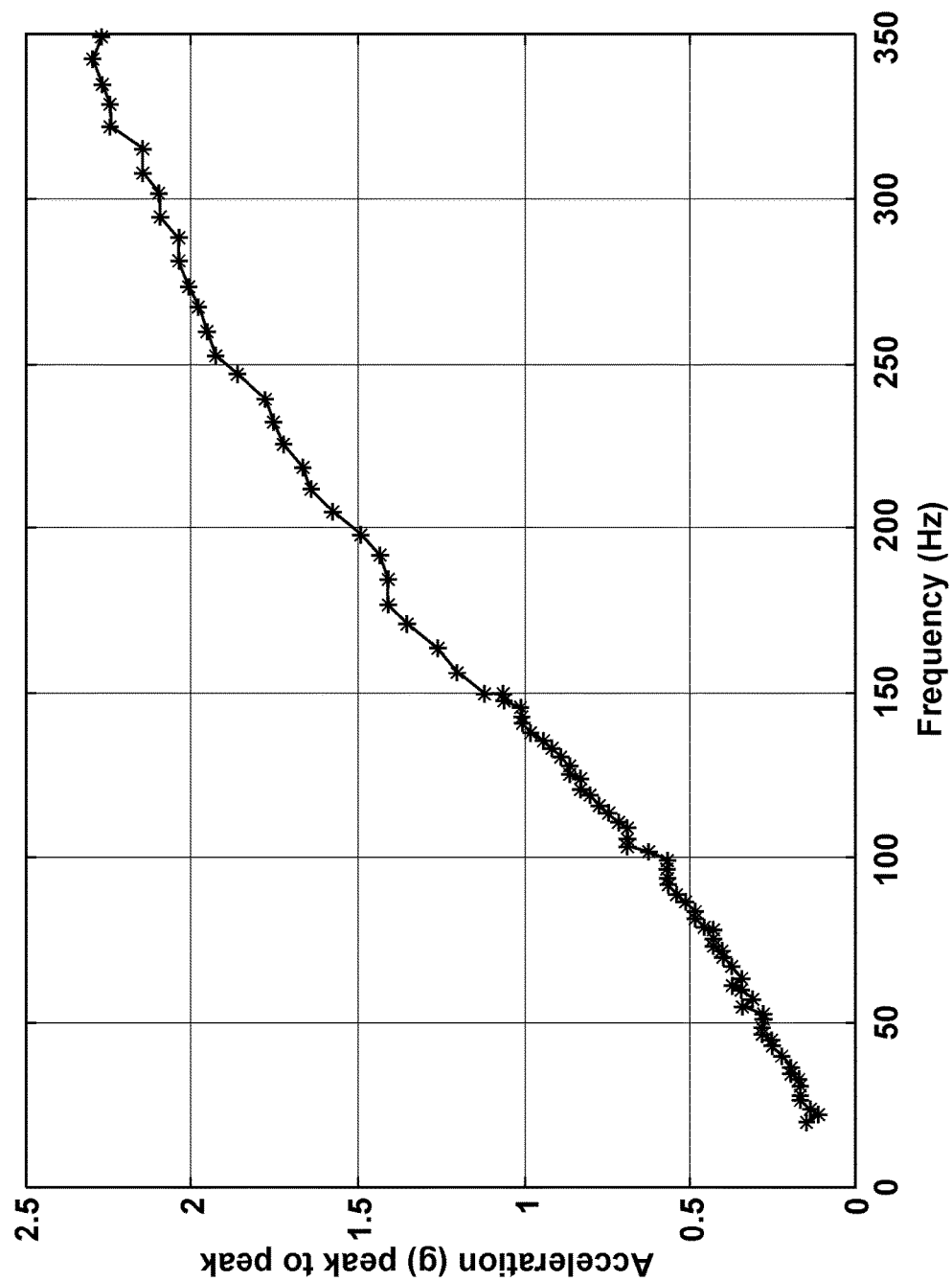
FIG. 5D shows acceleration versus frequency for the MFC actuator illustrated in FIGS. 5A-5C.

FIGS. 5A-5C in contrast, show an embodiment of a linear MFC actuator (P1-type) as described herein, in which an MFC is disposed between two laminate layers. Measurements of the acceleration (Gs) of the linear MFC actuator/laminate construct as a function of time demonstrates significant movement in the X direction (FIG. 5A), i.e., in the planar direction of the MFC and the laminate layers, some acceleration in the Z direction, and very small acceleration in the Y direction. The X direction has the highest acceleration because that is the direction of actuation provided by the actuator as described in FIG. 2D. The Z axis has also some acceleration because the actuator, when moving display element 220, creates some acceleration in the normal direction. The Y axis has the lowest acceleration because the actuator does not move in that direction. FIG. 5D shows the peak-to-peak acceleration versus frequency data used to construct FIGS. 5A-5C.

Several embodiments are specifically illustrated and/or described herein. However, it will be appreciated that modifications and variations of the disclosed embodiments are covered by the above teachings and within the purview of the appended claims without depending from the spirit and intended scope of the invention.

What is claimed is:

1. A conformable display, comprising:
   a display element; and
   a linear macro-fiber composite (MFC) actuator, including:
   a first laminate layer, a second laminate layer, and a macro-fiber composite actuator disposed between the first laminate layer and the second laminate layer,
   wherein the linear MFC actuator is attached to the display element and also attached to a support structure.

2. The conformable display of claim 1, wherein the linear MFC actuator is configured to translate the display element in a planar direction.

3. The conformable display of claim 1, wherein the display element includes a polymeric material.

4. The conformable display of claim 1, wherein the first laminate layer and the second laminate layer include a polymeric material.

5. A conformable display, comprising:
   a first display layer;
   a second display layer; and
   a macro-fiber composite (MFC) actuator disposed between the first display layer and the second display layer.

6. The conformable display of claim 5, wherein the first display layer and the second display layer include a polymeric material.

7. The conformable display of claim 5, comprising at least two MFC actuators disposed between the first display layer and the second display layer.

8. The conformable display of claim 5, including four MFC actuators disposed between the first display layer and the second display layer, the four MFC actuators positioned at four opposing corners of the conformable display.

9. The conformable display of claim 8, wherein two of the MFC actuators positioned on a side of the conformable display are expanding MFC actuators, and two of the MFC actuators positioned on an opposite side of the conformable display are contracting MFC actuators.

10. The conformable display of claim 5, wherein the MFC actuator is configured to translate the conformable display in a planar direction.

11. The conformable display of claim 5, wherein the conformable display is flat.

12. The conformable display of claim 5, wherein the conformable display is curved.

13. A conformable surface, comprising:
    a surface element; and
    a linear macro-fiber composite (MFC) actuator, including:
    a first laminate layer, a second laminate layer, and a macro-fiber composite actuator disposed between the first laminate layer and the second laminate layer,
    wherein the linear MFC actuator is attached to the surface element and also attached to a support structure.

14. The conformable surface of claim 13, wherein the surface element includes a polymeric material.

15. The conformable surface of claim 13, wherein the first laminate layer and the second laminate layer include a polymeric material.

16. The conformable surface of claim 13, wherein the linear MFC actuator is configured to translate the surface element in a planar direction.

* * * * *